United States Patent
Djemour et al.

(10) Patent No.: US 12,532,490 B2
(45) Date of Patent: Jan. 20, 2026

(54) INPUT CAPACITANCE ENHANCEMENT FOR ESD RUGGEDNESS IN SEMICONDUCTOR DEVICES

(71) Applicant: Infineon Technologies AG, Neubiberg (DE)

(72) Inventors: Rabie Djemour, Munich (DE); Hannes Mathias Geike, Munich (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 921 days.

(21) Appl. No.: 17/686,506

(22) Filed: Mar. 4, 2022

(65) Prior Publication Data
US 2023/0282736 A1  Sep. 7, 2023

(51) Int. Cl.
*H10D 12/00* (2025.01)
*H10D 12/01* (2025.01)
*H10D 62/10* (2025.01)
*H10D 64/00* (2025.01)

(52) U.S. Cl.
CPC ......... *H10D 12/481* (2025.01); *H10D 12/035* (2025.01); *H10D 62/105* (2025.01); *H10D 64/117* (2025.01)

(58) Field of Classification Search
CPC ............. H01L 29/7397; H01L 29/0615; H01L 29/407; H01L 29/0696; H10D 64/117; H10D 80/251; H10D 12/481; H10D 30/668; H10D 89/921; H10D 89/60
See application file for complete search history.

(56) References Cited

U.S. PATENT DOCUMENTS

| | | | |
|---|---|---|---|
| 2009/0242977 A1* | 10/2009 | Kawaguchi | H01L 29/7827 257/330 |
| 2013/0146972 A1* | 6/2013 | Rutter | H01L 29/407 257/334 |
| 2017/0040423 A1* | 2/2017 | Inoue | H01L 29/7813 |
| 2020/0168719 A1* | 5/2020 | Liu | H01L 29/66727 |
| 2022/0130997 A1* | 4/2022 | Harrington, III | H01L 29/401 |

* cited by examiner

*Primary Examiner* — Matthew C Landau
(74) *Attorney, Agent, or Firm* — Murphy, Bilak & Homiller, PLLC

(57) ABSTRACT

A semiconductor die includes: a semiconductor substrate; transistor cells formed in a first region of the semiconductor substrate and electrically coupled in parallel to form a power transistor, the transistor cells including first trenches that extend from a first surface of the semiconductor substrate into the first region; a gate pad formed above the first surface and electrically connected to gate electrodes in the first trenches, the gate pad being formed over a second region of the semiconductor substrate that is devoid of functional transistor cells; second trenches extending from the first surface into the second region and including gate electrodes that are electrically connected to the gate pad and form a first conductor of an additional input capacitance of the power transistor; and a second conductor of the additional input capacitance formed in the second region adjacent the second trenches. Methods of producing the semiconductor die are also described.

20 Claims, 5 Drawing Sheets

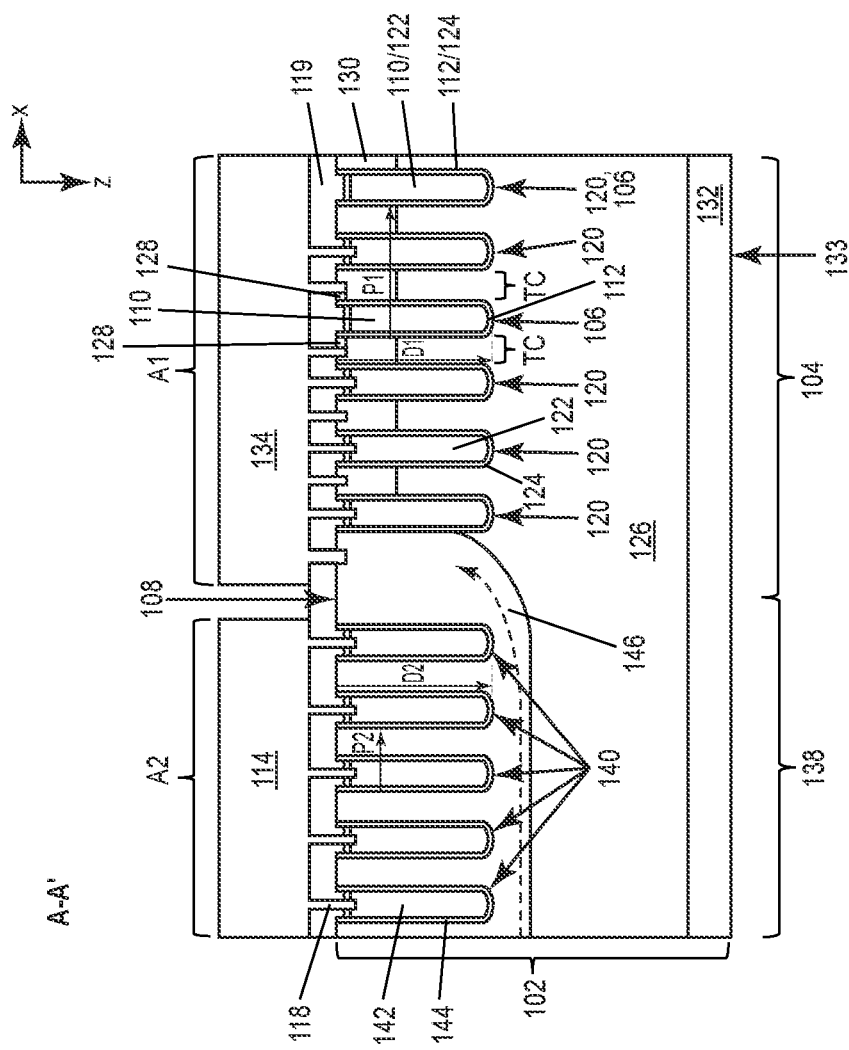
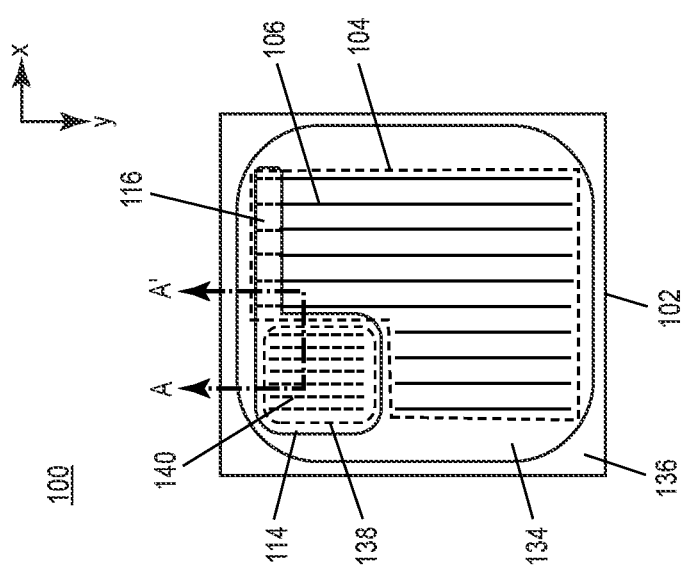
FIG. 2
FIG. 1

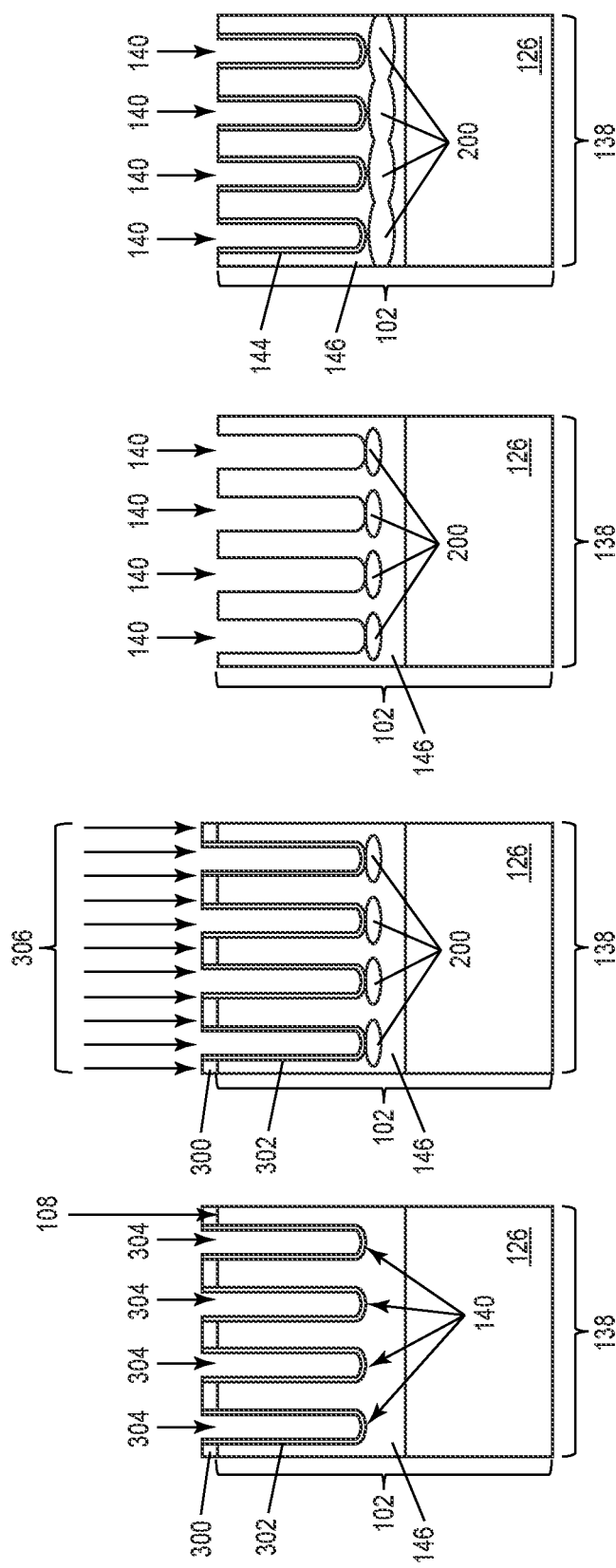

INPUT CAPACITANCE ENHANCEMENT FOR ESD RUGGEDNESS IN SEMICONDUCTOR DEVICES

BACKGROUND

For gate-controlled semiconductor devices such as IGBTs (insulated-gate bipolar transistors), the ESD (electrostatic discharge) ruggedness capability of the die (chip) correlates with the input capacitance of the chip and thus with the effective chip size. Accordingly, smaller area dies (e.g., active area of 5 mm$^2$ or less) having a relatively smaller gate pad area compared to larger dies are particularly susceptible to ESD due to the smaller gate pad area. To improve the ESD ruggedness for such small-area dies, a space- and/or cost-intensive additional circuit of ESD diodes is required.

Thus, there is a need for semiconductor dies with improved ESD ruggedness but without requiring an additional circuit of ESD diodes.

SUMMARY

According to an embodiment of a semiconductor die, the semiconductor die comprises: a semiconductor substrate; a plurality of transistor cells formed in a first region of the semiconductor substrate and electrically coupled in parallel to form a power transistor, the plurality of transistor cells including first trenches that extend from a first surface of the semiconductor substrate into the first region; a gate pad formed above the first surface and electrically connected to gate electrodes in the first trenches, the gate pad being formed over a second region of the semiconductor substrate that is devoid of functional transistor cells; a plurality of second trenches extending from the first surface into the second region and including gate electrodes that are electrically connected to the gate pad and form a first conductor of an additional input capacitance of the power transistor; and a second conductor of the additional input capacitance formed in the second region adjacent the plurality of second trenches.

According to another embodiment of a semiconductor die, the semiconductor die comprises: a semiconductor substrate; a power transistor formed in a first region of the semiconductor substrate and including a plurality of gate trenches in the first region, the plurality of gate trenches including gate electrodes that are capacitively coupled to the semiconductor substrate and contribute to an input capacitance of the power transistor; a gate pad formed over a second region of the semiconductor substrate that is devoid of functional transistor cells; and a plurality of additional gate trenches formed in the second region, the plurality of additional gate trenches including additional gate electrodes that are capacitively coupled to the semiconductor substrate and increase the input capacitance of the power transistor.

According to an embodiment of a method of producing a semiconductor die, the method comprises: forming a plurality of transistor cells in a first region of a semiconductor substrate, the plurality of transistor cells being electrically coupled in parallel to form a power transistor and including first trenches that extend from a first surface of the semiconductor substrate into the first region; forming a gate pad above the first surface and over a second region of the semiconductor substrate that is devoid of functional transistor cells, the gate pad being electrically connected to gate electrodes in the first trenches; forming a plurality of second trenches extending from the first surface into the second region, the plurality of second trenches including gate electrodes that are electrically connected to the gate pad and form a first conductor of an additional input capacitance of the power transistor; and forming a second conductor of the additional input capacitance in the second region adjacent the plurality of second trenches.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a top plan view of an embodiment of a semiconductor die having an input capacitance enhancement feature under the gate pad of the die.

FIG. 2 illustrates a corresponding cross-sectional view of the semiconductor die along the line labelled A-A' in FIG. 1.

FIGS. 5A through 5D illustrate respective partial cross-sectional views of an embodiment of forming the input capacitance enhancement feature.

DETAILED DESCRIPTION

Figure 4:
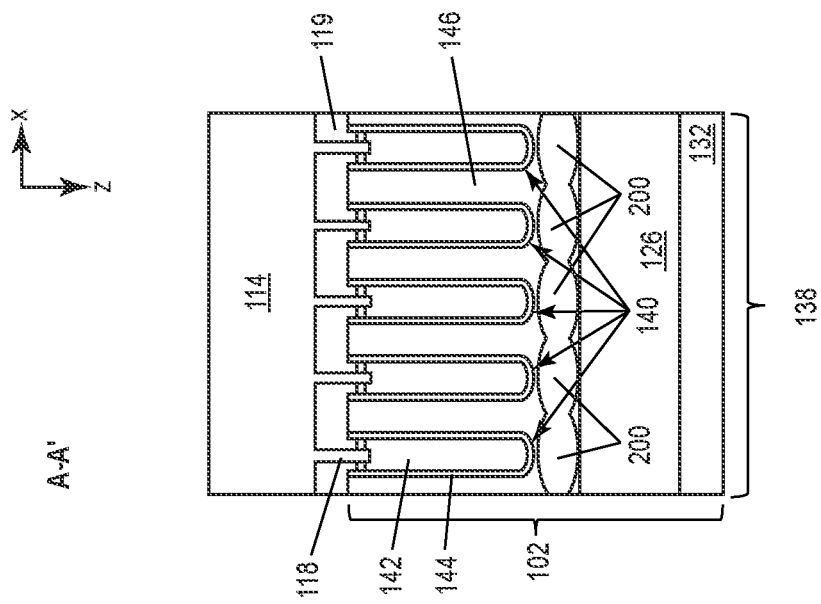
FIG. 4 illustrates a corresponding cross-sectional view of the semiconductor die along the line labelled A-A' in FIG. 3.

The embodiments described herein provide a gate pad modification that yields enhanced ESD ruggedness. The gate pad modification includes a gate trench arrangement in the die substrate below the gate pad and that increases the effective gate pad area. A larger effective gate area increases the associated input capacitance which in turn enhances ESD ruggedness, particularly ESD HBM (human body model) ruggedness. The gate trench arrangement under the gate pad may have the same or different configuration (e.g., shape, dimensions, etc.) as the gate trench arrangement in the active area of the die. In either case, the gate trench arrangement under the gate pad increases the effective gate pad area and thus the effective input capacitance.

Gate charge is conventionally minimized to reduce drive requirements but is intentionally increased herein because the die is relatively small (e.g., active area of 5 mm$^2$ or less) compared to larger dies. For example, a semiconductor die rated for 2 A but with increased input capacitance could still be driven by a standard 5 A driver. Depending on the nominal current range, this translates to below 10 to 15 Amps. The active area and current rating examples given above are for illustration only and should not be considered limiting.

Described next with reference to the figures are embodiments of the input capacitance enhancement feature and methods of producing semiconductor dies with increased input capacitance.

FIG. 1 illustrates a top plan view of an embodiment of a semiconductor die 100 and FIG. 2 illustrates a corresponding cross-sectional view of the semiconductor die 100 along the line labelled A'A' in FIG. 1. The semiconductor die 100 includes a semiconductor substrate 102. The semiconductor substrate 102 comprises one or more semiconductor materials that are used to form a power transistor such as, e.g., Si or SiC power MOSFET (metal-oxide-semiconductor field-effect transistor), an IGBT, JFET (junction FET), etc. For example, the semiconductor substrate 102 may comprise Si, silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material.

Transistor cells 'TC' are formed in a first (active) region 104 of the semiconductor substrate 102 and electrically coupled in parallel to form a power transistor. For example, the transistor cells TC may form an IGBT, a power MOSFET, JFET, etc. The semiconductor die 100 may have tens, hundreds, thousands, or even more transistors cells. In one embodiment, the first region 104 of the semiconductor substrate 102 has an area of 5 mm$^2$ or less.

The transistor cells TC include first trenches 106 that extend from a first surface 108 of the semiconductor substrate 102 into the first region 104. The first trenches 106 may be 'stripe-shaped' in that the first trenches 106 may have a longest linear dimension in a direction (y direction in FIG. 1) that is parallel to the first surface 108 of the semiconductor substrate 102 and transverses the depth-wise direction (z direction in FIG. 2) of the semiconductor substrate 102.

The first trenches 106 are gate 'G' trenches that include a gate electrode 110 separated from the surrounding semiconductor substrate 102 by a gate dielectric insulating material 112. The gate electrodes 110 are electrically connected to a gate pad 114 through, e.g., one or more metal gate runners 116 and respective contacts/vias 118 that are out of view in FIG. 2 in the first region 104 and that extend through an interlayer dielectric 119 formed on the first surface 108 of the semiconductor substrate 102. The connections between the gate electrodes 110 and the gate pad 114 include/form an additional $R_{G,INT}$. The gate pad 114 may comprise a single metal layer or a stack of metal layers.

Field plate trenches 120 may extend from the first surface 108 into the semiconductor substrate 102 in the first region 104. The field plate trenches 120 help optimize the area-specific on-state resistance achievable for a given breakdown voltage, by providing charge carrier compensation, or for shaping the input, output and feedback capacitances, by way of example. The field plate trenches 120 may be stripe-shaped like the first trenches 106. Alternatively, the field plate trenches 120 may be needle-shaped in that the field plate trenches 120 are narrow and long in a depth-wise direction (z direction in FIG. 2) of the semiconductor substrate 102 and may resemble a needle, column or spicule in the depth-wise direction of the semiconductor substrate 102. The field plate trenches 120 are not shown in FIG. 1 to emphasize the gate trench configuration.

Each field plate trench 120 includes a field plate 122 and a field dielectric insulating material 124 that separates the field plate 122 from the surrounding semiconductor substrate 102. The field plates 122 and the gate electrodes 110 may be made from any suitable electrically conductive material such as but not limited to polysilicon, metal (e.g., tungsten), metal alloy, etc. The field plates 122 and the gate electrodes 110 may comprise the same or different electrically conductive material. The gate dielectric insulating material 112 may comprise, e.g., SiOx and may be formed by thermal oxidation and/or deposition, for example. The field dielectric insulating material 124 may comprise the same or different material as the gate dielectric insulating material 112 and/or may be thicker than the gate dielectric insulating material 112 at least along the bottom of the field plate trenches 120, for example.

The semiconductor die 100 also includes a drift region 126 of a first conductivity type in the semiconductor substrate 102. Source/emitter regions 128 of the first conductivity type in the first region 104 of the semiconductor substrate 102 are separated from the drift region 126 by a respective body region 130 of a second conductivity type. In the case of a JFET or Si or SiC power MOSFET, a drain region 132 of the first conductivity type adjoins the drift region 126 at the backside 133 of the semiconductor substrate 102. In the case of an IGBT, the drain region 132 of the first conductivity type is instead a collector region of the second conductivity type. An additional layer (not shown) of the first conductivity type and doped more heavily than the drift region 126 may separate the collector region 132 from the drift region 126.

The first conductivity is n-type and the second conductivity type p-type for an n-channel device, whereas the first conductivity is p-type and the second conductivity type n-type for a p-channel device. For either n-channel or p-channel devices, the source/emitter regions 128 and the body regions 130 form part of the transistor cells TC that are electrically connected in parallel between a source/emitter pad 134 and the drain/collector region 132 to form a power transistor. The source/emitter pad 134 may comprise a single metal layer or a stack of metal layers. The source/emitter pad 134 and interlayer dielectric 119 formed on the first surface 108 of the semiconductor substrate 102 are not shown in FIG. 1 to provide an unobstructed view of the first (gate) trenches 106 formed in the semiconductor substrate 102. A passivation layer 136 may protect the die 100 and have at least one opening that exposes at least part of the gate pad 114 and at least part of the source/emitter pad 134.

The body regions 130 may include a body contact region (not shown) of the second conductivity type and having a higher doping concentration than the body regions 130, to provide an ohmic connection to the source/emitter potential provide by the source/emitter pad 134. The source/emitter regions 128 are also at source/emitter potential. The field plates 122 also may be electrically connected to the source/emitter potential, or to a different potential. Not all field plates 122 need be at the same potential. Some or all of the field plates 122 may be electrically floating, i.e., not connected to a defined potential.

Regardless of the type of power transistor implemented by the transistor cells TC, the gate pad 114 is formed over a second (inactive) region 138 of the semiconductor substrate 102 that is devoid of functional transistor cells. That is, the transistor cells TC in the first region 104 of the semiconductor substrate 102 contribute to the main current flow of the power transistor. No such transistor cells TC are formed in the second region 138 of the semiconductor substrate. For example, incomplete transistor cells that are missing at least a source/emitter region 128 and/or a body region 130 may be formed in the second region 138 of the semiconductor substrate 102. However, these 'incomplete' transistors cells are not fully functional in that they do not contribute to the main current flow of the power transistor.

Second trenches 140 extend from the first surface 108 into the second region 138 of the semiconductor substrate 102.

The second trenches 140 include electrodes 142 that are separated from the surrounding semiconductor substrate 102 by a dielectric insulating material 144. The gate trench arrangement under the gate pad 114 may have the same or different same shape and pattern as the gate trench arrangement under the source/emitter pad 134 in the active region 104 of the die 100. For example, the second trenches 140 and the first trenches 106 may each be striped-shaped. However, the second trenches 140 and the first trenches 106 may have different shapes since the second region 138 of the semiconductor substrate 102 is devoid of functional transistor cells. For example, the first trenches 106 may be striped-shaped and the second trenches 140 may be needle-shaped. More generally, the second trenches 140 may be in the form of interrupted lines, needles, closed circles, etc. To simplify the manufacturing process, the second trenches 140 and the first trenches 106 may have the same shape and pattern.

The second trenches 140 in the second region 138 of the semiconductor substrate 102 may extend deeper (D2>D1) into the semiconductor substrate 102 relative to the first surface 108 as compared to the first trenches 106 in the first region 104, which yields an even higher input capacitance. For example, in the case of using RIE (reactive ion etch) for trench etching, a RIE-lag effect may occur where an increased opening area (e.g., increased mask width) causes a dry RIE process to etch deeper into the semiconductor substrate 102 in the gate pad area 138 as compared to the active area 104 with the same process. In general, the second trenches 140 may extend to the same depth in the semiconductor substrate 102 as the first trenches 106 (D2=D1), the second trenches 140 may extend deeper in the semiconductor substrate 102 than the first trenches 106 (D2>D1), or the second trenches 140 may terminate in the semiconductor substrate 102 at a shallower depth than the first trenches 106 (D2<D1).

The electrodes 142 in the second trenches 140 are electrically connected to the gate pad 114, e.g., by respective contacts/vias 118 and form a first conductor of an additional input capacitance ($C_{IN\_add}$) of the power transistor. A second conductor of the additional input capacitance $C_{IN\_add}$ is formed in the second region 138 of the semiconductor substrate 102 adjacent the second trenches 140. The second conductor of the additional input capacitance $C_{IN\_add}$ may be electrically coupled to source/emitter potential, for example.

According to the embodiment illustrated in FIG. 2, the second conductor of the additional input capacitance $C_{IN\_add}$ is formed by a well region 146 of the second conductivity type in the second region 138 of the semiconductor substrate 102. The well region 146 of the second conductivity type vertically separates the drift region 126 from the second trenches 140 in the second region 138 of the semiconductor substrate 102. For an n-channel transistor device, the well region 146 in which the second trenches 140 are formed is a p-type well region. For a p-channel transistor device, the well region 146 in which the second trenches 140 are formed is an n-type well region.

In one embodiment, the well region 146 of the second conductivity type in the second region 138 of the semiconductor substrate 102 has a doping concentration at least ten times higher than the charge carrier concentration in the on-state of the power transistor in the first region 104 of the substrate 102. For example, the doping concentration of the well region 146 may be around $10^{17}$ cm$^{-3}$ and the charge carrier concentration in the on-state of the power transistor in the first region 104 of the substrate 102 may be around $10^{16}$ cm$^{-3}$. More generally, the doping concentration of the well region 146 may be in a range of $10^{17}$ to $10^{19}$, for example.

The additional input capacitance $C_{IN\_add}$ provided in the second region 138 of the semiconductor substrate 102 increases the overall gate capacitance of the semiconductor die 100 which in turn enhances ESD ruggedness, particularly ESD HBM ruggedness. In one embodiment, the first trenches 106 in the first region 104 have a lateral pitch P1 along a direction x in FIG. 2. In between two neighboring first trenches there may be no, one, two or even more field plate trenches 120. The first region 104 covers a first area A1 of the semiconductor substrate 102. The second trenches 120 underneath the gate pad 114 have a lateral pitch P2 along direction x. The gate pad 114 covers a second area A2 of the semiconductor substrate 102 which may be up to 30% of the total substrate area. With this design, the additional input capacitance $C_{IN\_add}$ provided in the second region 138 of the semiconductor substrate 102 increases the overall input capacitance of the power transistor by $$\frac{P1}{P2} \times \frac{A2}{A1}$$

neglecting stray capacitances, e.g., at the ends of second trenches 120 or of needle shaped second trenches 120. Assuming by way of example the pitch P1 being three times of P2 (e. g. two field plate trenches 120 between two first trenches 106 along the lateral direction x) and the second area A2 having 30% of the first area A1, the additional input capacitance may reach 90% of the original input capacitance.

During turn-off of the power transistor included in the semiconductor die 100, holes are removed from the drift region 126 via the well region 146 in the second region 138 of the semiconductor substrate 102 and the corresponding source/emitter contacts 118, in case the power transistor is a bipolar power device like an IGBT. In case the power transistor is an n-channel MOSFET, holes are removed from the well region 146 while electrons are removed from the drift region while building up a blocking voltage or space charge region, respectively. There are no source/emitter contacts 118 under the gate pad 114. Accordingly, holes have to travel laterally to the nearest grouping of source/emitter contacts 118 as indicated by the dashed arrow in FIG. 2. This causes the charge plasma, which is at the potential of the rear side drain/collector 132, to last longer and a lateral voltage drop occurs across the well region 146. The dielectric insulating material 144 at the bottom of the second trenches 140 may be overstressed by an excessive lateral voltage during turn-off, depending on how effectively the well region 146 shields the electric insulating material 144 from the high electric field.

Figure 3:
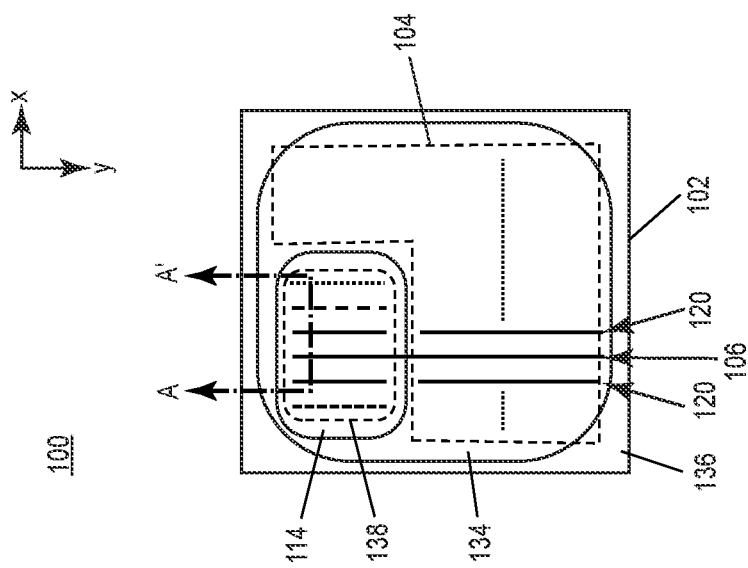
FIG. 3 illustrates a top plan view of another embodiment of a semiconductor die having an input capacitance enhancement feature under the gate pad of the die.

FIGS. 3 and 4 illustrate an embodiment of the semiconductor die 100 according to which enhanced shielding of the dielectric insulating material 144 at the bottom of the second trenches 140 is provided by a doped region 200 of the second conductivity type formed at the bottom of each second trench 140 in the well region 146 of the second conductivity type. The doped region 200 of the second conductivity type at the bottom of each second trench 140 is doped more heavily than the well region 146 to provide enhanced electric field shielding for the electric insulating material 144 at the bottom of the second trenches 140. The doped region 200 of the second conductivity type at the bottom of the second trenches 140 is electrically connected to the source/emitter pad 134 to provide a reference/earth/ground potential to the area under the gate pad 114. The doped region 200 of the second conductivity type at the bottom of the second trenches 140 also enhances the counter electrode for the additional input capacitance CIN add provided in the second region 138 of the semiconductor substrate 102, further increasing the overall input capacitance of the semiconductor die 100. In one embodiment, the doped region 200 of the second conductivity type at the bottom of each second trench 140 are interconnected as shown in FIG. 4.

Embedding the second trenches 140 in the well region 146 of the second conductivity type in the second region 138 of the semiconductor substrate 102 with the addition of the doped region 200 of the second conductivity type at the bottom of each second trench 140 leads to increased gate-emitter-capacitances with a negligible gate-collector capacitance increase. However, no major influence on the dV/dt voltage slew rate is expected during switching of the power transistor formed in the first region 104 of the semiconductor substrate 102. Only a minor increase of gate charge/input capacitance is expected.

In the case of a semiconductor die 100 with a relatively small active area, e.g., of 5 mm$^2$ or less, only a marginal influence is expected on the gate drive unit for the power transistor. For example, a semiconductor die 100 rated for 2 A but with increased gate capacitance for enhanced ESD ruggedness as described herein could still be driven by a standard 5 A driver. The semiconductor die 100 may have an active area larger than 5 mm$^2$ and still utilize the ESD ruggedness enhancement technique described herein, by using a driver with a larger current drive capability. The additional input capacitance $C_{IN\_add}$ provided by the embodiments described herein can reduce the di/dt current slew rate during turn-on of the power transistor while maintaining the dV/dt voltage slew rate at a given gate resistance. Increasing the gate resistance also reduces the di/dt current slew rate but at the same time reduces the dV/dt voltage slew rate which further increases turn-on losses.

By increasing the additional input capacitance $C_{IN\_add}$ as described herein, the gate-emitter(source) capacitance increases which reduces the di/dt current slew rate during initial turn on since the gate current has to charge a larger capacitance. This is beneficial in reducing the electromagnetic interference. Conventional devices typically use a large gate resistor to implement the desired di/dt turn on behavior. However, when current through the power transistor reaches a final load value, the voltage across the emitter(source) and collector(drain) terminals of the power transistor drops. Facing the Miller capacitance and a large gate resistance, the dV/dt voltage slew rate decreases which increases losses because more time is needed for the voltage across the power transistor to reach the saturation voltage. By increasing the additional input capacitance CIN add as described herein, and during the dV/dt condition, a comparatively small gate resistor is present which provides additional gate current which in turn increases the dV/dt voltage slew rate and thereby reduces losses. Accordingly, the embodiments described herein may be beneficial in larger dies (e.g., active area larger than 5 mm$^2$) as well.

As shown in FIG. 3, at least some of the second trenches 140 under the gate pad 114 may be used as active gate trenches in the first region 104 of the semiconductor substrate 102 where the power transistor cells TC are formed. For example, along the border between the first region 104 and the second region 138 of the semiconductor substrate 102, at least one of the second trenches 140 may extend (in the y direction in FIG. 3) into the first region 104 and interconnect with a corresponding first trench 106 to form a continuous trench that runs uninterrupted in a lengthwise direction between the first and second regions 104, 138. A gate runner connection is not needed to provide gate potential to the first trench 106 which is merged with this second trench 140. As previously explained herein, the second trenches 140 under the gate pad 114 are at gate potential. Hence, the second trenches 140 that align with a field plate trench 120 that is at source/emitter potential are terminated in the y direction in FIG. 3 before merging with the neighboring field plate trench 120 to prevent shorting of the gate and source/emitter potentials.

Since under the gate pad 114 the second trenches 140 are directly contacted by contacts/vias 118, the minimum length of the second trenches 140 in the y direction in FIG. 3 is defined by the minimum length of the contacts/vias 118 as indicated by the dashed and dotted lines in FIG. 3. In one embodiment, at least some of the second trenches 140 in the second region 138 of the semiconductor substrate 102 are segmented into a plurality of spaced apart sections along a length (y direction in FIG. 3) of the second trenches 140 as indicated by the dashed and dotted lines in FIG. 3. Separately or in combination, at least some of the second trenches 140 in the second region 138 may be needle shaped in that at least some of the second trenches 140 may be narrow and long in a depth-wise direction (z direction in FIG. 4) of the semiconductor substrate 102 and may resemble a needle, column or spicule in the depth-wise direction of the semiconductor substrate 102.

FIGS. 5A through 5D illustrate an embodiment of forming the doped region 200 of the second conductivity type at the bottom of the second trenches 140 in the second region 138 of the semiconductor substrate 102.

FIG. 5A shows a mask layer 300 formed on the first surface 108 of the semiconductor substrate 102 before formation of a sacrificial oxide 302. In one embodiment, the mask layer 300 is a hard mask patterned using a resist mask. The mask layer 300 has openings 304 through which the second trenches 140 are etched into the second region 138 of the semiconductor substrate 102. The same mask layer 300 may be used to etch the first trenches 106 into the first region 104 of the semiconductor substrate 102 using a common etch (e.g., dry RIE) process. The sacrificial oxide 302 is formed on the sidewalls and bottom of the second trenches 140 e. g. using a thermal oxidation process.

FIG. 5B shows an ion implantation process for forming the doped region 200 of the second conductivity type at the bottom of each second trench 140 in the well region 146 of the second conductivity type. The ion implantation process includes implanting one or more dopant species 306 of the second conductivity type into the bottom of each second trench 140. In the case of an n-channel device and SiC or Si as the substrate 102, the dopant species 306 may include aluminum and/or boron. In the case of a p-channel device, the dopant species 306 may include nitrogen for SiC as the substrate 102 and/or phosphorus for Si as the substrate 102. In either case, the doped region 200 of the second conductivity type is doped more heavily than the well region 146 of the second conductivity type.

FIG. 5C shows the second trenches 104 after removal of the sacrificial oxide 302. The sacrificial oxide 302 may be removed using a diluted HF solution, for example.

FIG. 5D shows the structure after formation of the dielectric insulating material 144 that lines the sidewalls and bottom of the second trenches 140. The dielectric insulating material 144 may be formed by a thermal oxidation process, for example. The thermal oxidation process may include annealing at elevate temperature, which results in out-diffusion of the implanted dopant species 306. The out-diffusion may result in the doped region 200 of the second conductivity type at the bottom of the second trenches 140 becoming interconnected, e.g., as shown in FIG. 5D.

Figure 6A:
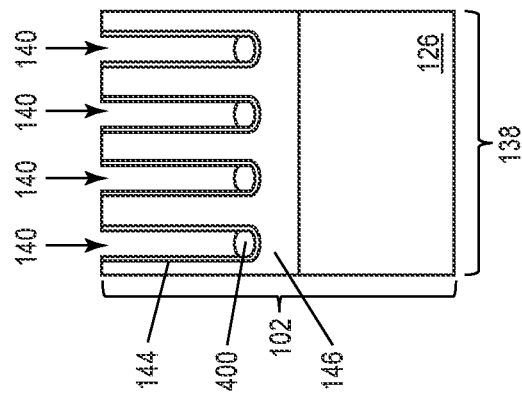
FIGS. 6A through 6C illustrate respective partial cross-sectional views of another embodiment of forming the input capacitance enhancement feature.
Figure 6B:
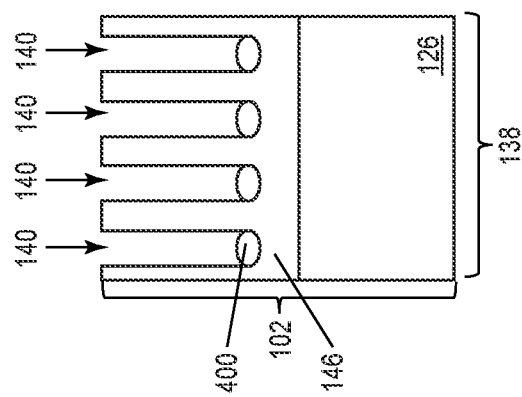
Figure 6C:
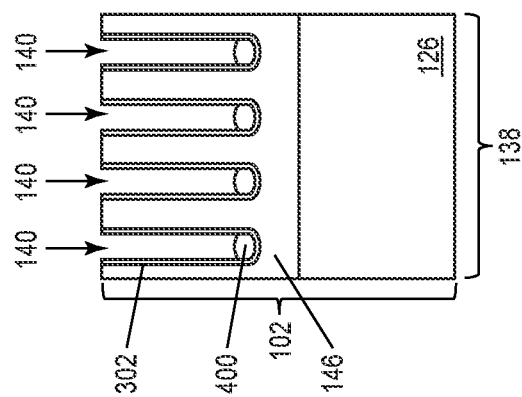

FIGS. 6A through 6C illustrate another embodiment of enhancing the electric field shielding provided in the second region 138 of the semiconductor substrate 102. According to this embodiment, the thickness of the dielectric insulating material that separates the gate electrodes 142 in the second trenches 140 from the semiconductor substrate 102 in the second region 138 is greater at the bottom of the second trenches 140 than along the sidewalls of the second trenches 140.

FIG. 6A shows a sacrificial oxide 302 lining the sidewalls and bottom of the second trenches 140 and a thicker bottom oxide 400 formed in the bottom of the second trenches 140. The thicker bottom oxide 210 may be deposited in the bottom of the second trenches 140 by high density plasma (HDP) oxide deposition. HDP oxide deposition involves the anisotropic deposition of silicon oxide which takes place mostly on horizontal surfaces, with a very low deposition rate at the trench sidewalls.

FIG. 6B shows the structure after removal of the HDP oxide and the sacrificial oxide 302 from the sidewalls of the second trenches 140. The HDP oxide and the sacrificial oxide 302 may be removed from the trench sidewalls using a diluted HF solution, for example. Another example of forming the thicker bottom oxide 400 includes filling all trenches with oxide and then removing the oxide from the first trenches 106 but not the second trenches 140. More generally, the thicker bottom oxide 400 may be used only in the second trenches 140 or in both the first trenches 106 and the second trenches 140.

FIG. 6C shows the structure after formation of the (gate) dielectric insulating material 144 that lines the sidewalls of the second trenches 140. The dielectric insulating material 144 may be formed by a thermal oxidation process, for example. Owing to the prior deposition of the thicker bottom oxide 400, thickness of the dielectric insulating material that separates the gate electrodes 142 in the second trenches 140 from the semiconductor substrate 102 in the second region 138 is greater at the bottom of the second trenches 140 than along the sidewalls of the second trenches 140. Only the thinner dielectric insulating material 144 lines the sidewalls of the second trenches 140, whereas the bottom of each second trench 140 is covered by both the thicker bottom oxide 400 and the thinner dielectric insulating material 144. The additional thickness of the total dielectric insulating material (dielectric insulating material 144+thicker bottom oxide 400) at the bottom of the second trenches 140 enhances the electric field shielding provided in this part of the semiconductor die 100. The thick bottom oxide embodiment illustrated in FIGS. 6A through 6C may be combined with the trench bottom doping region embodiment illustrated in FIGS. 5A through 5D.

Figure 7:
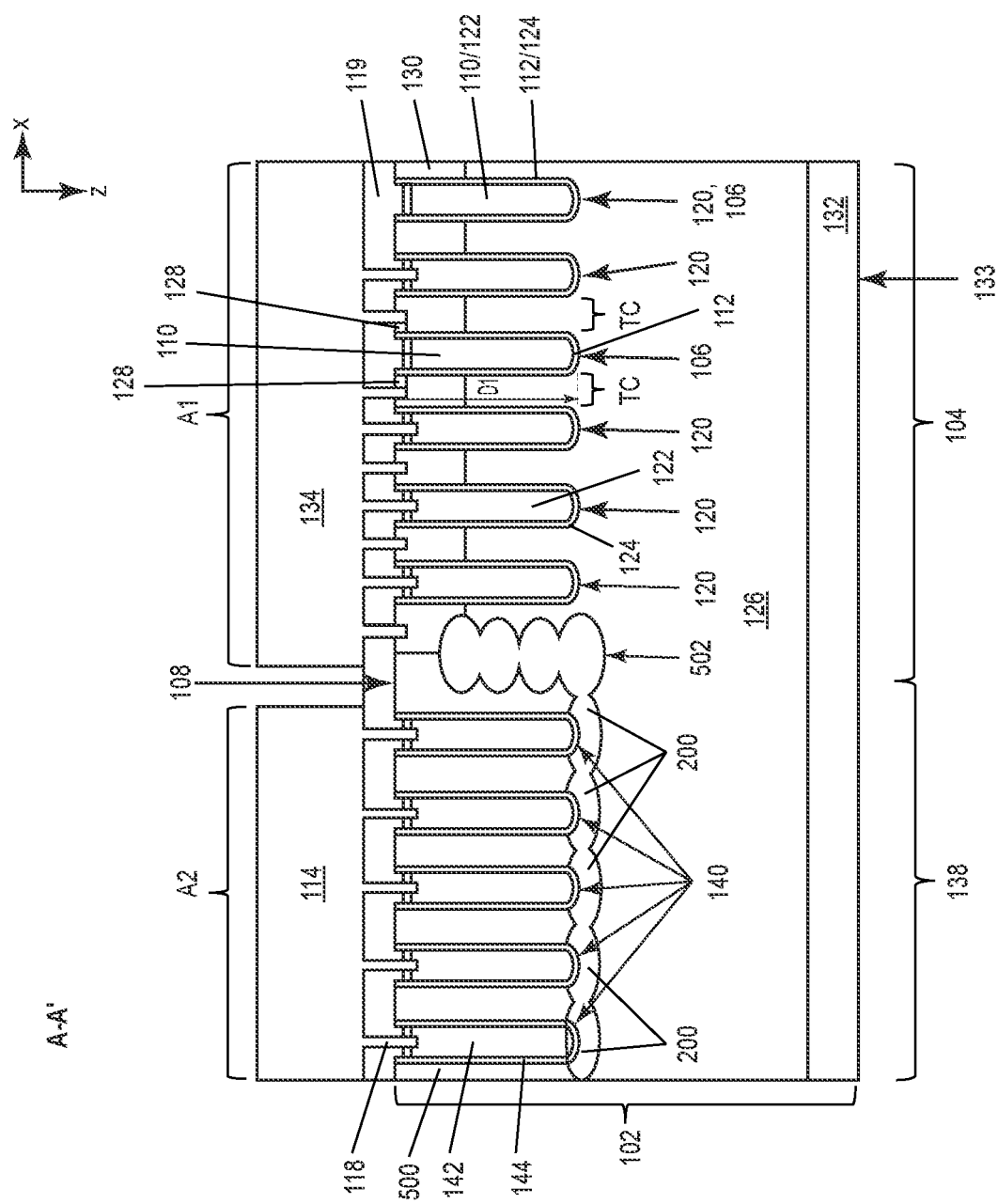
FIG. 7 illustrates a top plan view of another embodiment of a semiconductor die having an input capacitance enhancement feature under the gate pad of the die.

FIG. 7 illustrates another embodiment of the semiconductor die 100 in the second region 138 of the semiconductor substrate 102. According to this embodiment, the well region 146 of the second conductivity type in the second region 138 of the semiconductor substrate 102 is replaced by a doped region 500 of the first conductivity type that is vertically separated from the drift region 126 in the second region 138 by a doped region 200 of the second conductivity type formed at the bottom of each second trench 140 in the second region 138. The doped region 500 of the first conductivity type in the second region 138 of the semiconductor substrate 102 forms the second conductor of the additional input capacitance $C_{IN\_add}$. The doped region 500 of the first conductivity type in the second region 138 of the semiconductor substrate 102 may have a higher average doping concentration than the drift region 126 to reduce the series resistance of the additional input capacitance $C_{IN\_add}$.

A sinker region 502 of the second conductivity type provides lateral separation of the doped region 500 of the first conductivity type in the second region 138 from the drift region 126. The sinker region 502 of the second conductivity type also connects the doped region 200 of the second conductivity type formed at the bottom of each second trench 140 in the second region 138 to the body region 130 in the active region 104 and/or to the nearest emitter/source contacts 118. The sinker region 502 of the second conductivity type may be formed by multiple implantations with overlapping depths or by a small well region.

Although the present disclosure is not so limited, the following numbered examples demonstrate one or more aspects of the disclosure.

Example 1. A semiconductor die, comprising: a semiconductor substrate; a plurality of transistor cells formed in a first region of the semiconductor substrate and electrically coupled in parallel to form a power transistor, the plurality of transistor cells including first trenches that extend from a first surface of the semiconductor substrate into the first region; a gate pad formed above the first surface and electrically connected to gate electrodes in the first trenches, the gate pad being formed over a second region of the semiconductor substrate that is devoid of functional transistor cells; a plurality of second trenches extending from the first surface into the second region and including gate electrodes that are electrically connected to the gate pad and form a first conductor of an additional input capacitance of the power transistor; and a second conductor of the additional input capacitance formed in the second region adjacent the plurality of second trenches.

Example 2. The semiconductor die of example 12, further comprising a drift region of a first conductivity type and a well region of a second conductivity type opposite the first conductivity type both in the semiconductor substrate, wherein the well region separates the drift region from the plurality of second trenches in the second region.

Example 3. The semiconductor die of example 1, wherein the power transistor includes a drift region of the first conductivity type in the semiconductor substrate, wherein the second conductor of the additional input capacitance is formed by a doped region of the first conductivity type that is separated from the drift region in the second region, and wherein the doped region of the first conductivity type has a higher average doping concentration than the drift region.

4. The semiconductor die of any of example 1, wherein the power transistor includes a drift region of a first conductivity type in the semiconductor substrate, wherein the second conductor of the additional input capacitance is formed by a well region of a second conductivity type opposite the first conductivity type, and wherein the well region of the second conductivity type vertically separates the drift region from the plurality of second trenches in the second region.

Example 5. The semiconductor die of example 4, further comprising: a doped region of the second conductivity type at a bottom of each second trench in the well region of the second conductivity type and doped more heavily than the well region of the second conductivity type.

Example 6. The semiconductor die of example 5, wherein the doped region of the second conductivity type at the bottom of each second trench are interconnected.

Example 7. The semiconductor die of any of examples 1 through 6, wherein a gate dielectric separates the gate electrodes in the second trenches from the semiconductor substrate in the second region, and wherein a thickness of the gate dielectric is greater at a bottom of the second trenches than along sidewalls of the second trenches.

Example 8. The semiconductor die of any of examples 1 through 7, wherein the second trenches in the second region extend deeper into the semiconductor substrate relative to the first surface as compared to the first trenches in the first region.

Example 9. The semiconductor die of any of examples 1 through 8, wherein the first region of the semiconductor substrate has an area of 5 mm$^2$ or less.

Example 10. The semiconductor die of any of examples 1 through 9, wherein the additional input capacitance increases the overall input capacitance of the power transistor by P1/P2×A2/A1 where P1 is a lateral pitch of the first trenches along a first lateral direction, P2 is a lateral pitch of the second trenches along the first lateral direction, A1 is a first area of the semiconductor substrate covered by the first region, and A2 is a second area of the semiconductor substrate covered by the gate pad.

Example 11. The semiconductor die of any of examples 1 through 10, wherein at least some of the second trenches in the second region are segmented into a plurality of spaced apart sections along a length of the second trenches.

Example 12. The semiconductor die of any of examples 1 through 11, wherein at least some of the second trenches in the second region are needle shaped.

Example 13. The semiconductor die of any of examples 1 through 10, wherein the second trenches in the second region have a same shape and pattern as the first trenches in the first region.

Example 14. The semiconductor die of any of examples 1 through 13, wherein along a border between the first region and the second region, at least one of the second trenches extends into the first region and interconnects with a corresponding first trench to form a continuous trench that runs uninterrupted in a lengthwise direction between the first and second regions.

Example 15. The semiconductor die of any of examples 1 through 14, wherein the second conductor of the additional input capacitance is electrically coupled to a source or emitter potential.

Example 16. A semiconductor die, comprising: a semiconductor substrate; a power transistor formed in a first region of the semiconductor substrate and including a plurality of gate trenches in the first region, the plurality of gate trenches including gate electrodes that are capacitively coupled to the semiconductor substrate and contribute to an input capacitance of the power transistor; a gate pad formed over a second region of the semiconductor substrate that is devoid of functional transistor cells; and a plurality of additional gate trenches formed in the second region, the plurality of additional gate trenches including additional gate electrodes that are capacitively coupled to the semiconductor substrate and increase the input capacitance of the power transistor.

Example 17. A method of producing a semiconductor die, the method comprising: forming a plurality of transistor cells in a first region of a semiconductor substrate, the plurality of transistor cells being electrically coupled in parallel to form a power transistor and including first trenches that extend from a first surface of the semiconductor substrate into the first region; forming a gate pad above the first surface and over a second region of the semiconductor substrate that is devoid of functional transistor cells, the gate pad being electrically connected to gate electrodes in the first trenches; forming a plurality of second trenches extending from the first surface into the second region, the plurality of second trenches including gate electrodes that are electrically connected to the gate pad and form a first conductor of an additional input capacitance of the power transistor; and forming a second conductor of the additional input capacitance in the second region adjacent the plurality of second trenches.

Example 18. The method of example 17, wherein the power transistor includes a drift region of a first conductivity type in the semiconductor substrate, and wherein forming the second conductor of the additional input capacitance comprises: forming a well region of a second conductivity type opposite the first conductivity type in the second region, such that the well region of the second conductivity type vertically separates the drift region from the plurality of second trenches in the second region.

Example 19. The method of example 17 or 18, further comprising: forming a doped region of the second conductivity type at a bottom of each second trench in the well region of the second conductivity type and doped more heavily than the well region of the second conductivity type.

Example 20. The method of any of examples 17 through 19, further comprising: forming a gate dielectric that separates the gate electrodes in the second trenches from the semiconductor substrate in the second region such that a thickness of the gate dielectric is greater at a bottom of the second trenches than along sidewalls of the second trenches.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
a semiconductor substrate;
a plurality of transistor cells formed in a first region of the semiconductor substrate and electrically coupled in parallel to form a power transistor, the plurality of transistor cells including first trenches that extend from a first surface of the semiconductor substrate into the first region;
a gate pad formed above the first surface and electrically connected to gate electrodes in the first trenches, the gate pad being formed over a second region of the semiconductor substrate that is devoid of functional transistor cells;
a plurality of second trenches extending from the first surface into the second region and including gate electrodes that are electrically connected to the gate pad and form a first conductor of an additional input capacitance of the power transistor; and
a second conductor of the additional input capacitance formed in the second region adjacent the plurality of second trenches,
wherein in the second region, the plurality of second trenches terminates in a doped region having a same conductivity type as a body region of the plurality of transistor cells and a gate dielectric separates the gate electrodes in the second trenches from the doped region.

2. The semiconductor die of claim 1, further comprising a drift region of a first conductivity type and a well region of a second conductivity type opposite the first conductivity type both in the semiconductor substrate, wherein the well region separates the drift region from the plurality of second trenches in the second region.

3. The semiconductor die of claim 1, wherein the power transistor includes a drift region of the first conductivity type in the semiconductor substrate, wherein the second conductor of the additional input capacitance is formed by a doped region of the first conductivity type that is separated from the drift region in the second region, and wherein the doped region of the first conductivity type has a higher average doping concentration than the drift region.

4. The semiconductor die of claim 1, wherein the power transistor includes a drift region of a first conductivity type in the semiconductor substrate, wherein the second conductor of the additional input capacitance is formed by a well region of a second conductivity type opposite the first conductivity type, and wherein the well region of the second conductivity type vertically separates the drift region from the plurality of second trenches in the second region.

5. The semiconductor die of claim 4, wherein the doped region in which the plurality of second trenches terminates in the second region comprises:
a doped region of the second conductivity type at a bottom of each second trench in the well region of the second conductivity type and doped more heavily than the well region of the second conductivity type.

6. The semiconductor die of claim 5, wherein the doped region of the second conductivity type at the bottom of each second trench are interconnected.

7. The semiconductor die of claim 1, wherein a thickness of the gate dielectric is greater at a bottom of the second trenches than along sidewalls of the second trenches.

8. The semiconductor die of claim 1, wherein the second trenches in the second region extend deeper into the semiconductor substrate relative to the first surface as compared to the first trenches in the first region.

9. The semiconductor die of claim 1, wherein the first region of the semiconductor substrate has an area of 5 mm² or less.

10. The semiconductor die of claim 1, wherein the additional input capacitance increases the overall input capacitance of the power transistor by $$\frac{P1}{P2} \times \frac{A2}{A1}$$

where P1 is a lateral pitch of the first trenches along a first lateral direction, P2 is a lateral pitch of the second trenches along the first lateral direction, A1 is a first area of the semiconductor substrate covered by the first region, and A2 is a second area of the semiconductor substrate covered by the gate pad.

11. The semiconductor die of claim 1, wherein at least some of the second trenches in the second region are segmented into a plurality of spaced apart sections along a length of the second trenches.

12. The semiconductor die of claim 1, wherein at least some of the second trenches in the second region are needle shaped.

13. The semiconductor die of claim 1, wherein the second trenches in the second region have a same shape and pattern as the first trenches in the first region.

14. The semiconductor die of claim 1, wherein along a border between the first region and the second region, at least one of the second trenches extends into the first region and interconnects with a corresponding first trench to form a continuous trench that runs uninterrupted in a lengthwise direction between the first and second regions.

15. The semiconductor die of claim 1, wherein the second conductor of the additional input capacitance is electrically coupled to a source or emitter potential.

16. A semiconductor die, comprising:
a semiconductor substrate;
a power transistor formed in a first region of the semiconductor substrate and including a plurality of gate trenches in the first region, the plurality of gate trenches including gate electrodes that are capacitively coupled to the semiconductor substrate and contribute to an input capacitance of the power transistor;
a gate pad formed over a second region of the semiconductor substrate that is devoid of functional transistor cells; and
a plurality of additional gate trenches formed in the second region, the plurality of additional gate trenches including additional gate electrodes that are capacitively coupled to the semiconductor substrate and increase the input capacitance of the power transistor,
wherein in the second region, the plurality of additional gate trenches terminates in a doped region having a same conductivity type as a body region of the power transistor and a gate dielectric separates the additional gate electrodes from the doped region.

17. A method of producing a semiconductor die, the method comprising:
forming a plurality of transistor cells in a first region of a semiconductor substrate, the plurality of transistor cells being electrically coupled in parallel to form a power transistor and including first trenches that extend from a first surface of the semiconductor substrate into the first region;

forming a gate pad above the first surface and over a second region of the semiconductor substrate that is devoid of functional transistor cells, the gate pad being electrically connected to gate electrodes in the first trenches;

forming a plurality of second trenches extending from the first surface into the second region, the plurality of second trenches including gate electrodes that are electrically connected to the gate pad and form a first conductor of an additional input capacitance of the power transistor; and forming a second conductor of the additional input capacitance in the second region adjacent the plurality of second trenches, wherein in the second region, the plurality of second trenches terminates in a doped region having a same conductivity type as a body region of the plurality of transistor cells and a gate dielectric separates the gate electrodes in the second trenches from the doped region.

18. The method of claim 17, wherein the power transistor includes a drift region of a first conductivity type in the semiconductor substrate, and wherein forming the second conductor of the additional input capacitance comprises:

forming a well region of a second conductivity type opposite the first conductivity type in the second region, such that the well region of the second conductivity type vertically separates the drift region from the plurality of second trenches in the second region.

19. The method of claim 18, further comprising:

Forming the doped region of the second conductivity type at a bottom of each second trench in the well region of the second conductivity type and doped more heavily than the well region of the second conductivity type, wherein in the second region, the plurality of second trenches terminates in the doped region of the second conductivity type at the bottom of each second trench.

20. The method of claim 17, further comprising forming the gate dielectric in the second region such that a thickness of the gate dielectric is greater at a bottom of the second trenches than along sidewalls of the second trenches.

* * * * *